United States Patent
Whitehead

(10) Patent No.: US 9,746,740 B2
(45) Date of Patent: Aug. 29, 2017

(54) REGISTERED REFLECTIVE ELEMENT FOR A BRIGHTNESS ENHANCED TIR DISPLAY

(71) Applicant: CLEARink Displays, Inc., Santa Clara, CA (US)

(72) Inventor: Lorne A. Whitehead, Vancouver (CA)

(73) Assignee: ClearINK Displays, Inc., Fremont, CA (US)

( * ) Notice: Subject to any disclaimer, the term of this patent is extended or adjusted under 35 U.S.C. 154(b) by 0 days.

(21) Appl. No.: 15/002,629

(22) Filed: Jan. 21, 2016

(65) Prior Publication Data

US 2016/0291439 A1    Oct. 6, 2016

Related U.S. Application Data

(63) Continuation of application No. 14/266,744, filed on Apr. 30, 2014, now Pat. No. 9,280,029.

(60) Provisional application No. 61/822,810, filed on May 13, 2013.

(51) Int. Cl.
| | |
|---|---|
| G02B 26/00 | (2006.01) |
| G02F 1/167 | (2006.01) |
| G02F 1/1335 | (2006.01) |
| G02F 1/19 | (2006.01) |
| G03F 7/00 | (2006.01) |
| G03F 7/20 | (2006.01) |

(Continued)

(52) U.S. Cl.
CPC ............ *G02F 1/167* (2013.01); *G02F 1/1336* (2013.01); *G02F 1/133514* (2013.01); *G02F 1/133553* (2013.01); *G02F 1/195* (2013.01); *G03F 7/0005* (2013.01); *G03F 7/2002* (2013.01); *G03F 7/32* (2013.01); *G03F 7/36* (2013.01); *G02F 2001/133616* (2013.01)

(58) Field of Classification Search
CPC .. G02F 1/167; G02F 1/1336; G02F 1/133514; G02F 1/133553; G02F 1/195; G02F 2001/133616; G03F 7/2002; G03F 7/36; G03F 7/32; G03F 7/0005
USPC ....... 359/296, 449, 455, 459, 534, 536, 537, 359/542, 618, 619, 621; 362/333, 335, 362/560; 445/24, 25
See application file for complete search history.

(56) References Cited

U.S. PATENT DOCUMENTS

| | | |
|---|---|---|
| 3,919,031 A | 11/1975 | White |
| 4,025,674 A | 5/1977 | Mizuochi |
| 4,071,430 A | 1/1978 | Liebert |

(Continued)

FOREIGN PATENT DOCUMENTS

| | | |
|---|---|---|
| AT | 333109 T | 8/2006 |
| CA | 2292441 C | 7/2002 |

(Continued)

OTHER PUBLICATIONS

International Search Report and Written Opinion dated Apr. 13, 2016 for PCT Application No. PCT/US2015/066980.

(Continued)

*Primary Examiner* — Tuyen Tra
(74) *Attorney, Agent, or Firm* — Dianoosh Salehi

(57) ABSTRACT

The brightness of a TIR-based display is enhanced with a registered reflective element by recycling and reflecting light that passes through the dark pupil region of each hemispherical protrusion in the hemi-spherical surface back to the viewer. A method to fabricate a brightness enhanced TIR display comprising an apertured membrane with a thin conductive reflective metal layer facing and registered with the pupils of the hemi-spherical surface.

8 Claims, 7 Drawing Sheets

(51) Int. Cl.
*G03F 7/32* (2006.01)
*G03F 7/36* (2006.01)

(56) References Cited

U.S. PATENT DOCUMENTS

| | | | |
|---|---|---|---|
| 4,203,106 A | 5/1980 | Dalisa et al. |
| 4,821,092 A | 4/1989 | Noguchi |
| 5,019,748 A | 5/1991 | Appelberg |
| 5,319,491 A | 6/1994 | Selbrede |
| 5,359,346 A | 10/1994 | DiSanto |
| 5,396,350 A | 3/1995 | Beeson et al. |
| 5,596,671 A | 1/1997 | Rockwell, III |
| 5,871,653 A | 2/1999 | Ling |
| 5,959,777 A | 9/1999 | Whitehead |
| 5,999,307 A | 12/1999 | Whitehead et al. |
| 6,064,784 A | 5/2000 | Whitehead et al. |
| 6,215,920 B1 | 4/2001 | Whitehead et al. |
| 6,304,365 B1 | 10/2001 | Whitehead et al. |
| 6,376,828 B1 | 4/2002 | Comiskey |
| 6,377,383 B1 | 4/2002 | Whitehead et al. |
| 6,384,979 B1 | 5/2002 | Whitehead et al. |
| 6,437,921 B1 | 8/2002 | Whitehead |
| 6,452,734 B1 | 9/2002 | Whitehead et al. |
| 6,574,025 B2 | 6/2003 | Whitehead et al. |
| 6,751,008 B2 | 6/2004 | Liang et al. |
| 6,822,783 B2 | 11/2004 | Matsuda et al. |
| 6,842,279 B2 | 1/2005 | Amundson |
| 6,865,011 B2 | 3/2005 | Whitehead et al. |
| 6,885,496 B2 | 4/2005 | Whitehead et al. |
| 6,891,658 B2 | 5/2005 | Whitehead et al. |
| 7,046,439 B2 | 5/2006 | Kaminsky et al. |
| 7,093,968 B2 | 8/2006 | Hsueh et al. |
| 7,164,536 B2 | 1/2007 | Whitehead |
| 7,170,670 B2 | 1/2007 | Webber |
| 7,286,280 B2 | 10/2007 | Whitehead et al. |
| 7,324,263 B2 | 1/2008 | Johnson et al. |
| 7,422,964 B2 | 9/2008 | Akiyama |
| 7,439,948 B2 | 10/2008 | Johnson et al. |
| 7,463,398 B2 | 12/2008 | Feenstra |
| 7,507,012 B2 | 3/2009 | Aylward et al. |
| 7,515,326 B2 | 4/2009 | Selbrede et al. |
| 7,564,614 B2 | 7/2009 | Chen et al. |
| 7,660,509 B2 | 2/2010 | Bryan et al. |
| 7,740,387 B2 | 6/2010 | Schultz et al. |
| 7,760,417 B2 | 7/2010 | Whitehead |
| 7,775,700 B2 | 8/2010 | Lee |
| 7,852,430 B1 | 12/2010 | Gettmey |
| 8,022,615 B2 | 9/2011 | Bai et al. |
| 8,040,591 B2 | 10/2011 | Whitehead |
| 8,094,364 B2 | 1/2012 | Park |
| 8,384,659 B2 | 2/2013 | Yeo et al. |
| 8,587,512 B2 | 11/2013 | Hiji et al. |
| 8,690,408 B2 | 4/2014 | Li |
| 9,377,574 B2 | 6/2016 | Li |
| 2002/0171910 A1 | 11/2002 | Pullen et al. |
| 2003/0038755 A1 | 2/2003 | Amundson et al. |
| 2003/0067666 A1 | 4/2003 | Kawai |
| 2003/0165016 A1 | 9/2003 | Whitehead et al. |
| 2003/0214697 A1 | 11/2003 | Duthaler et al. |
| 2004/0136047 A1 | 7/2004 | Whitehead et al. |
| 2004/0174584 A1 | 9/2004 | Whitehead et al. |
| 2004/0239613 A1 | 12/2004 | Kishi |
| 2006/0056009 A1 | 3/2006 | Kombrekke et al. |
| 2006/0148262 A1 | 7/2006 | Lee et al. |
| 2006/0209418 A1 | 9/2006 | Whitehead |
| 2006/0291034 A1 | 12/2006 | Patry et al. |
| 2007/0008739 A1 | 1/2007 | Kim et al. |
| 2007/0019434 A1 | 1/2007 | Lee |
| 2007/0091434 A1 | 4/2007 | Garner et al. |
| 2007/0263137 A1 | 11/2007 | Shigeta et al. |
| 2008/0174852 A1 | 7/2008 | Hirai et al. |
| 2008/0203910 A1 | 8/2008 | Reynolds |
| 2008/0219024 A1 | 9/2008 | Mi et al. |
| 2008/0231960 A1 | 9/2008 | Van Gorkom et al. |
| 2008/0266245 A1 | 10/2008 | Wilcox |
| 2008/0285282 A1 | 11/2008 | Karman et al. |
| 2008/0297496 A1 | 12/2008 | Watson et al. |
| 2008/0304134 A1 | 12/2008 | Ban |
| 2009/0109172 A1 | 4/2009 | Lee et al. |
| 2009/0201565 A1 | 8/2009 | Bita et al. |
| 2009/0201570 A1 | 8/2009 | Frazier et al. |
| 2009/0225398 A1 | 9/2009 | Duthaler et al. |
| 2009/0231714 A1 | 9/2009 | Zhao et al. |
| 2009/0262083 A1 | 10/2009 | Parekh |
| 2009/0322669 A1 | 12/2009 | Bryning et al. |
| 2010/0079843 A1 | 4/2010 | Derichs et al. |
| 2010/0085627 A1 | 4/2010 | Whitehead |
| 2010/0091224 A1 | 4/2010 | Cho et al. |
| 2010/0118383 A1 | 5/2010 | Van Abeelen et al. |
| 2010/0148385 A1 | 6/2010 | Balko et al. |
| 2010/0225575 A1 | 9/2010 | Ishii et al. |
| 2011/0043435 A1 | 2/2011 | Hebenstreit et al. |
| 2011/0085232 A1 | 4/2011 | Werner et al. |
| 2011/0273906 A1 | 11/2011 | Nichol et al. |
| 2011/0299014 A1 | 12/2011 | Jang et al. |
| 2011/0310465 A1 | 12/2011 | Takanashi |
| 2011/0316764 A1 | 12/2011 | Parry-Jones et al. |
| 2012/0008203 A1 | 1/2012 | Ijzerman et al. |
| 2012/0019896 A1 | 1/2012 | Yoshida et al. |
| 2012/0019899 A1 | 1/2012 | Yeo |
| 2012/0069064 A1 | 3/2012 | Yamakita |
| 2012/0081777 A1 | 4/2012 | Heikenfeld et al. |
| 2012/0113367 A1 | 5/2012 | Kitson et al. |
| 2012/0113499 A1 | 5/2012 | Komatsu |
| 2012/0293857 A1 | 11/2012 | Kwon et al. |
| 2013/0182311 A1 | 7/2013 | Mochizuki et al. |
| 2013/0278995 A1 | 10/2013 | Drzaic et al. |
| 2014/0333989 A1 | 11/2014 | Whitehead |
| 2014/0340376 A1 | 11/2014 | Itagaki et al. |
| 2015/0146273 A1 | 5/2015 | Whitehead |
| 2016/0097961 A1 | 4/2016 | Whitehead |
| 2016/0139478 A1 | 5/2016 | Whitehead |

FOREIGN PATENT DOCUMENTS

| | | |
|---|---|---|
| CA | 2371138 C | 7/2005 |
| CA | 2410955 C | 1/2007 |
| CA | 2474384 C | 8/2010 |
| CA | 2643808 C | 8/2013 |
| CN | 1173208 C | 10/2004 |
| CN | 1454327 A | 9/2008 |
| DE | 69825894 | 9/2005 |
| EP | 1118039 | 2/2003 |
| EP | 0988573 B1 | 8/2004 |
| EP | 1290486 B1 | 10/2004 |
| EP | 1368700 B1 | 7/2006 |
| JP | 2004085635 | 3/2004 |
| JP | 2007505330 | 3/2007 |
| JP | 3965115 | 6/2007 |
| JP | 2007279641 | 10/2007 |
| JP | 4113843 | 4/2008 |
| JP | 2009251215 | 10/2009 |
| JP | 4956610 | 3/2012 |
| JP | 2005519329 | 6/2017 |
| KR | 100949412 | 3/2010 |
| WO | 03075085 | 9/2003 |
| WO | 2005010604 | 2/2005 |
| WO | 2006108285 | 10/2006 |
| WO | 2014146937 | 9/2014 |

OTHER PUBLICATIONS

International Search Report and Written Opinion dated Apr. 21, 2016 for PCT Application No. PCT/US2016/017416.
International Search Report and Written Opinion dated Mar. 28, 2016 for PCT Application No. PCT/US2015/0066150.
International Search Report and Written Opinion dated Jul. 8, 2014 for PCT Application No. PCT/US2013/049606.
International Search Report and Written Opinion dated Dec. 30, 2014 for PCT Application No. PCT/US2014/058118.
nternational Search Report and Written Opinion dated Aug. 11, 2014 for PCT Application No. PCT/US2014/030966.

(56) References Cited

OTHER PUBLICATIONS

International Search Report and Written Opinion dated Sep. 19, 2014 for PCT Application No. PCT/US2014/038091.
International Search Report and Written Opinion dated Oct. 1, 2015 for PCT Application No. PCT/US2015/030349.
International Search Report and Written Opinion dated Apr. 3, 2015 for PCT Application No. PCT/US2014/061911.
International Search Report and Written Opinion dated Mar. 1, 2016 for PCT Application No. PCT/US2015/013725.
International Search Report and Written Opinion dated Jan. 27, 2016 for PCT Application No. PCT/US2015/054385.
International Search Report and Written Opinion dated Mar. 2, 2016 for PCT Application No. PCT/US2015/062075.
Gou, S. et al., "Transparent Superhydrophobic Surfaces for Applications of Controlled Reflectance" Applied Optics vol. 51, Issue No. 11, Apr. 10, 2012, pp. 1645-1653.
Whitehead, L. et al., "The Many Roles of Illumination in Information Display" Society for Information Display Symposium (Invited Paper), Issue No. 0097-966X/06/3701-0000, May 2010.
Wong, R. et al., "Electrochemical Threshold Conditions During Electro-Optical Switching of Ionic Electrophorectic Optical Devices" Applied Optics vol. 48, Issue No. 6, Feb. 20, 2009, pp. 1062-1072.
Whitehead, L. et al., "Reflections on Total Internal Reflection" Optics and Photonics News Feb. 2009, pp. 28-34.
Mossman, M. et al., "Observations of Total Internal Reflection at a Natural Super-Hydrophobic Surface" Physics in Canada vol. 64, Issue No. 1, Mar. 2008, pp. 7-11.
Hrudey, P. et al., "Application of Transparent Nanostructured Electrodes for Modulation of Total Internal Reflection" SPIE 2007 Conference Paper No. 6647 Aug. 2007, pp. 1-12.
Hrudey, P. et al., "Variable Diffraction Gratings Using Nanoporous Electrodes and Electrophoresis of Dye Ions" SPIE 2007 Conference Paper No. 6645 Aug. 2007, pp. 1-12.
Webster, A. et al., "Control of Reflection at an Optical Interface in the Absence of Total Internal Reflection for Retroreflective Display Application" Applied Optics vol. 45, Issue No. 6, Feb. 20, 2006, pp. 1169-1176.
Mossman, M. et al., "Off the Beaten Path with Total Internal Reflection" International Optical Design Conference (Invited Paper), Jun. 2006, pp. 1-12.
Whitehead, L. et al., "Total Internal Reflection for Illumination and Displays" SPIE Newsroom Sep. 7-8, 2006.
Mossman, M. et al., "Controlled Frustration of TIR by Electrophoresis of Pigment Particles" Applied Optics vol. 44, Issue No. 9, Mar. 20, 2005, pp. 1601-1609.
Kwong, V. et al., "Control of Reflectance of Liquid Droplets by Means of Electrowetting" Applied Optics vol. 43, Issue No. 4, Feb. 1, 2004, pp. 808-813.
Mossman, M. et al. "A High Reflectance, Wide Viewing Angle Reflective Display Using Total Internal Reflection in Mirco-Hemispheres" International Display Research Conference, Issue No. 1083-1312/00/2003-0233, Sep. 2003, pp. 233-236.
Mossman, M. et al., "Grey Scale Control of Total Internal Reflection Using Electrophoresis of Sub-Optical Pigment Particles" International Conference of the Society for Information Display, Boston, MA Issue No. 2-0966X/02/3301-0522, May 2002, pp. 522-525.
Coope, R. et al., "Modulation of Retroreflection by Controlled Frustration of Total Internal Reflection" Applied Optics vol. 41, Issue No. 25, Sep. 1, 2002, pp. 5357-5361.
Mossman, M. et al., "New Method for Maintaining Long Term Image Quality in a TIR Based Electrophoretic Display" International Display Research Conference, Nice, France, Eurodisplay Oct. 2002, pp. 851-854.
Mossman, M. et al., "New Reflective Color Display Technique Based on Total Internal Reflection and Subtractive Color Filtering" International Conference of the Society for Information Display, San Jose, CA Issue No. 1-0966X/01/3201-1054, Jun. 2001, pp. 1054-1057.
Whitehead, L. et al., "Visual Applications of Total Internal Reflection in Prismatic Microstructures" Physics in Canada Nov./Dec. 2001, pp. 329-335.
Mossman, M. et al., "A New Reflective Display Based on Total Internal Reflection in Prismatic Microstructures" Proceedings of the 2000 Society for Information Display, International Display Research Conference, Issue No. 1083-1312/00/2001-0311, Oct. 2000, pp. 311-314.
Mossman, M. A. et al., "A Novel Reflective Image Display Using Total Internal Reflection" Displays Devices, DEMPA Publications, Tokyo JP vol. 25, No. 5 Dec. 1, 2004 pp. 215-221.

REGISTERED REFLECTIVE ELEMENT FOR A BRIGHTNESS ENHANCED TIR DISPLAY

CROSS REFERENCE TO RELATED APPLICATIONS

This application is a continuation of U.S. patent application Ser. No. 14/266,744, filed Apr. 30, 2014, which claims the filing date benefit of Provisional Application 61/822,810 filed on May 13, 2013, the entirety of which is incorporated herein by reference.

TECHNICAL FIELD

This application pertains to frustration of total internal reflection (TIR) in high brightness, wide viewing angle displays of the type described in U.S. Pat. Nos. 6,885,496; 6,891,658; 7,286,280; 7,760,417 and 8,040,591; all of which are incorporated herein by reference for background. More particularly, this application pertains to enhancing the brightness in TIR-based displays.

BACKGROUND

FIG. 1 depicts a portion of a prior art reflective (i.e. front-lit) frustrated total internal reflection (TIR) modulated display 10 of the type described in U.S. Pat. Nos. 6,885,496; 6,891,658; 7,760,417 and 8,040,591. These patents describe an entirely new design of the outward sheet that was previously described in U.S. Pat. Nos. 5,959,777; 5,999,307; 6,064,784; 6,215,920; 6,304,365; 6,384,979; 6,437,921; 6,452,734 and 6,574,025 which comprised of, for example, various spatially uniform prism structures, dielectric light fibers, parallel, and perpendicular and interleaved structures. As a result of the closely packed, spherical or hemi-spherical beaded, outward sheet design first described in patents '496' and '658', the practical angular viewing range of frustrated TIR or other reflective display methods was increased. The new design offers semi-retro-reflective gain, whereby light rays which are incident on the surface of the convex protrusions in the shape of hemispherical beads are reflected back (but not exactly retro-reflected) toward the light source; which means that the reflection is enhanced when the light source is overhead and slightly behind the viewer, and that the reflected light has a diffuse characteristic giving it a white appearance, which is desirable in reflective display applications.

Display 10 in FIG. 1 includes a transparent outward sheet 12 formed by partially embedding a large plurality of high refractive index (e.g. $\eta_1 > \sim 1.90$) transparent spherical or approximately spherical beads (it is noted that said spherical or approximately spherical beads may also be "hemi-spherical beads" or "hemi-beads" or "beads" or "hemi-spherical protrusions" or "hemi-spheres" or "convex protrusions" and these terms may be used interchangeably) 14 in the inward surface of a high refractive index (e.g. $\eta_2 \approx \eta_1$) polymeric material 16 having a flat outward viewing surface 17 which viewer V observes through an angular range of viewing directions Y. The "inward" and "outward" directions are indicated by double-headed arrow Z. Beads 14 are packed closely together to form an inwardly projecting monolayer 18 having a thickness approximately equal to the diameter of one of beads 14. Ideally, each one of beads 14 touches all of the beads immediately adjacent to that one bead. Minimal interstitial gaps (ideally, no gaps) remain between adjacent beads.

An electro-active TIR-frustrating medium 20 is maintained adjacent the portions of beads 14 which protrude inwardly from material 16 by containment of medium 20 within a reservoir 22 defined by lower sheet 24. An inert, low refractive index (i.e. less than about 1.35), low viscosity, electrically insulating liquid such as, but not limited to, Fluorinert™ perfluorinated hydrocarbon liquid ($\eta_3 \sim 1.27$) available from 3M, St. Paul, Minn. is a suitable fluid for the medium 20. Other liquids such as Novec™ also available from 3M may also be used as the fluid for medium 20. A bead:liquid TIR interface is thus formed. Medium 20 contains a finely dispersed suspension of light scattering and/or absorptive particles 26 such as inorganic or organic pigments, dyes, dyed or otherwise scattering/absorptive silica or latex particles, etc. Sheet 24's optical characteristics are relatively unimportant as sheet 24 need only form a reservoir for containment of electro-active TIR-frustrating medium 20 and particles 26, and serve as a support for backplane electrode 48.

In the absence of TIR-frustrating activity, as is illustrated to the right of dashed line 28 in FIG. 1, a substantial fraction of the light rays passing through sheet 12 and beads 14 undergoes TIR at the inward side of beads 14. For example, representative incident light rays 30 and 32 are refracted through material 16 and beads 14. The light rays undergo TIR two or more times at the bead:liquid TIR interface, as indicated at points 34 and 36 in the case of ray 30; and indicated at points 38 and 40 in the case of ray 32. The totally internally reflected rays are then reflected back through beads 14 and material 16 and emerge as rays 42 and 44 respectively, achieving a "white" appearance in each reflection region or pixel.

A voltage can be applied across medium 20 via electrodes 46 and 48 which can for example be applied by, for example, vapor-deposition to the inwardly protruding surface portion of beads 14 and to the outward surface of sheet 24. Electrode 46 is transparent and substantially thin to minimize its interference with light rays at the bead:liquid TIR interface. Backplane electrode 48 need not be transparent. If TIR-frustrating medium 20 is activated by actuating voltage source 50 to apply a voltage between electrodes 46 and 48 as illustrated to the left of dashed line 28, suspended particles 26 are electrophoretically moved into the region where the evanescent wave is relatively intense (i.e. within about 0.25 micron of the inward surfaces of inwardly protruding beads 14, or closer). When electrophoretically moved as aforesaid, particles 26 scatter or absorb light, thus frustrating or modulating TIR by modifying the imaginary and possibly the real component of the effective refractive index at the bead:liquid TIR interface. This is illustrated by light rays 52 and 54 which are scattered and/or absorbed as they strike particles 26 inside the thin evanescent wave region at the bead:liquid TIR interface, as indicated at points 56 and 58 respectively, thus achieving a "dark" appearance in each TIR-frustrated non-reflective absorption region or pixel. Particles 26 need only be moved outside the thin evanescent wave region, by suitably actuating voltage source 50, in order to restore the TIR capability of the bead:liquid TIR interface and convert each "dark" non-reflective absorption region or pixel to a "white" reflection region or pixel.

As described above, the net optical characteristics of outward sheet 12 can be controlled by controlling the voltage applied across medium 20 via electrodes 46 and 48. The electrodes can be segmented to electrophoretically control the particles suspended in the TIR frustrating, low refractive index medium 20 across separate regions or pixels of sheet 12, thus forming an image.

As shown in FIGS. 2A-2G of a closer examination of an individual hemi-bead 60, reflectance of a the hemi-bead 60 is maintained over a broad range of incidence angles, thus enhancing display 10's wide angular viewing characteristic and its apparent brightness. For example, FIG. 2A shows hemi-bead 60 as seen from perpendicular incidence—that is, from an incidence angle offset 0° from the perpendicular and r is the radius of the hemispherical bead. In this case, the portion 80 of hemi-bead 60 appears as an annulus. The annulus is depicted as white, corresponding to the fact that this is the region of hemi-bead 60 which reflects incident light rays by TIR, as aforesaid. The annulus surrounds a circular region 82 which is depicted as dark, also referred to as the "pupil", corresponding to the fact that this is the non-reflective region of hemi-bead 60 within which incident rays pass through and may be absorbed and do not undergo TIR. FIGS. 2B-2G show hemi-bead 60 as seen from incident angles which are respectively offset 15°, 30°, 45°, 60°, 75°, and 90° from the perpendicular. Comparison of FIGS. 2B-2G with FIG. 2A reveals that the observed area of reflective portion 80 of hemi-bead 60 decreases only gradually as the incidence angle increases. Even at near glancing incidence angles (e.g. FIG. 2F) an observer will still see a substantial part of reflective portion 80, thus giving display 10 shown in FIG. 1 a wide angular viewing range over which high apparent brightness is maintained.

SUMMARY

The reflective, white annular region 80 surrounding the non-reflective, dark circular region 82 shown in FIGS. 2A-2G presents a problem sometimes referred to as the "dark pupil" problem which reduces the reflectance of the display. The display's performance is further reduced by transparent electrode 46, which may be formed by provision of a transparent conductive coating on hemi-beads 14 as shown in FIG. 1. Such coatings typically absorb about 5% to 10% of the incident light. Since a TIR light ray typically reflects several times, this can make it difficult to achieve efficient reflection. The dark pupil problem can be addressed by reflecting light rays back towards hemi-beads 14 (i.e. "recycling") which pass through the non-reflective, dark circular region of any of the plurality of hemi-beads 14 in display 10 in FIG. 1. The invention described in this application is directed to "recycling" of such light rays to enhance the brightness in TIR-based displays.

An embodiment of the invention describes the addition of a reflective element comprising of, for example, an apertured, insulating membrane facing the surface of convex protrusions in the shape of hemi-beads or hemi-spheres further comprising a conductive coating which additionally avoids the need for a transparent conductive coating on the hemi-spherical surface. The membrane with a reflective and conductive layer facing the inward hemi-bead/hemi-spherical surface is substantially registered with the circular regions of the hemi-beads such that when light rays that pass through the dark pupil region of the outward sheet comprising of a hemi-bead/hemi-spherical inward surface during the light state of the TIR display are recycled and reflected back to the viewer. A method to fabricate said registered and reflective membrane is additionally described herein.

The foregoing examples of the related art and limitations related thereto are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

DETAILED DESCRIPTION

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

Figure 3:
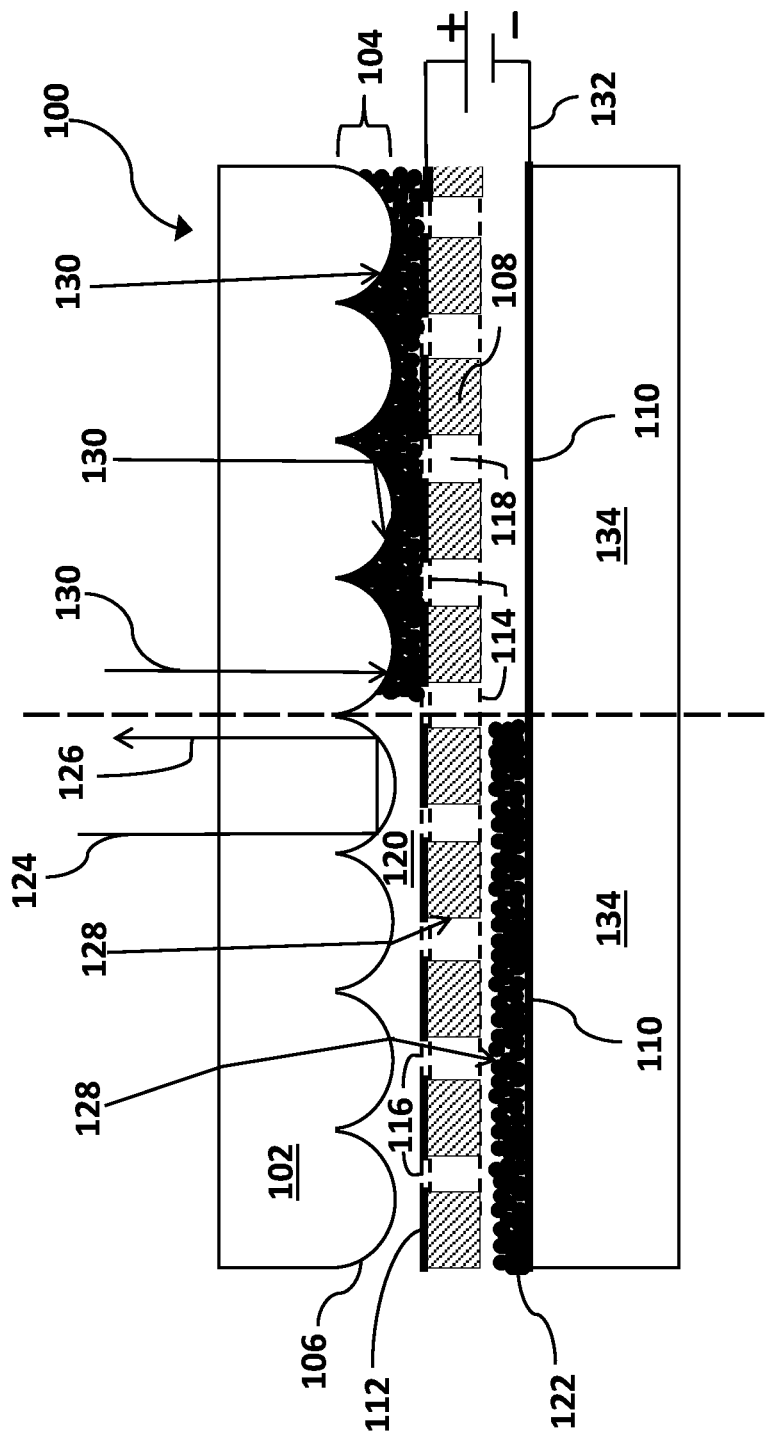
FIG. 3 depicts a TIR display in the light state (left of the dotted line) and dark state (right of the dotted line) with an unregistered reflective membrane where light rays pass through the dark pupil regions and are lost by escaping through the apertures.

FIG. 3 depicts a cross-section of display 100 comprising of a transparent outer sheet 102 further comprising of a plurality of inwardly protruding convex protrusions in the shape of hemi-spheres 104 forming a contoured surface 106. As depicted, display 100's hemi-spherical surface 106 is formed integrally with display 100's transparent outer sheet 102, whereas prior art display 10's hemi-spherical surface is formed by a closely packed layer of discrete beads 14 partially embedded in sheet 12. Either form or other similar hemi-spherical surface structure can be used. It should be noted forthwith that hemi-spherical protrusions may also be described more generally as convex protrusions and is covered by the invention described herein. It is not intended to limit the invention described herein by using the term hemi-spherical protrusions or hemi-spheres, but simply to be more descriptive of an optional shape of the convex protrusions illustrated in the drawings.

Display 100 in FIG. 3 further comprises a thin electrically insulating membrane 108 placed between the hemi-spherical surface 106 and a backplane electrode 110. Membrane 108 may be formed of a polymeric material such as, but not limited to, Mylar® or polycarbonate, or some other material such as metal or glass. Membrane 108 further comprises a thin metal layer 112 on the outward side of membrane 108 which faces the hemi-spherical surface 106 acting as both an electrode and a light ray reflector. Membrane 108 is a continuous (represented by dotted lines 114 to imply a continuous layer) and apertured porous material. The metal layer 112 is also continuous (represented by dotted lines 116 to imply a continuous layer) and apertured like the membrane 108 such that apertures 118 penetrate both the metal layer and membrane 108. Display 100 contains a low refractive index medium 120 maintained between and adjacent the hemi-spherical surface 106 and backplane electrode 110. Suspended within the medium 120 are light absorbing, electrophoretically mobile particles 122 that can pass through apertures 118 in membrane 108, as display 100's pixels are selectively switched between the light reflecting TIR state depicted on the left side of the vertical dotted line in FIG. 3 and the dark or light absorbing frustrated TIR state depicted on the right side of the vertical dotted line in FIG. 3.

In the light reflecting state showed to the left of the vertical dotted line in FIG. 3, particles 122 are attracted to and accumulate at the backplane electrode 110. In the light absorbing or dark state as shown to the right of the vertical dotted line in FIG. 3, particles 122 are attracted to the metal layer 112 atop membrane 108 and adjacent the hemi-spherical surface 106 where TIR is frustrated thus preventing light being reflected outwardly through the dark pupil region of the hemi-spherical protrusions or hemi-beads which form the hemi-spherical surface 106.

Figure 1:
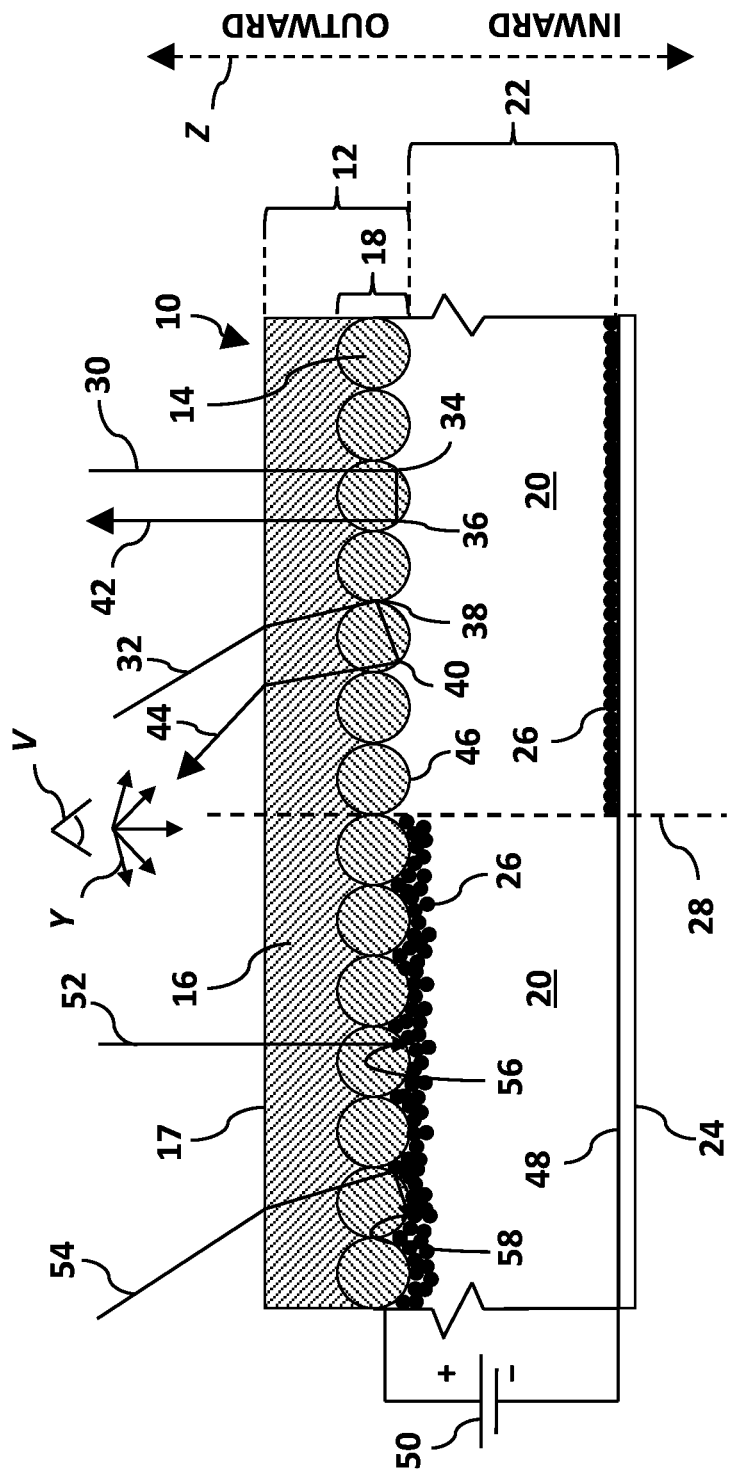
FIG. 1 is a greatly enlarged, not to scale, fragmented cross-sectional side elevation view, of a portion of a TIR frustrated or modulated prior art reflective image display.
Figure 2:
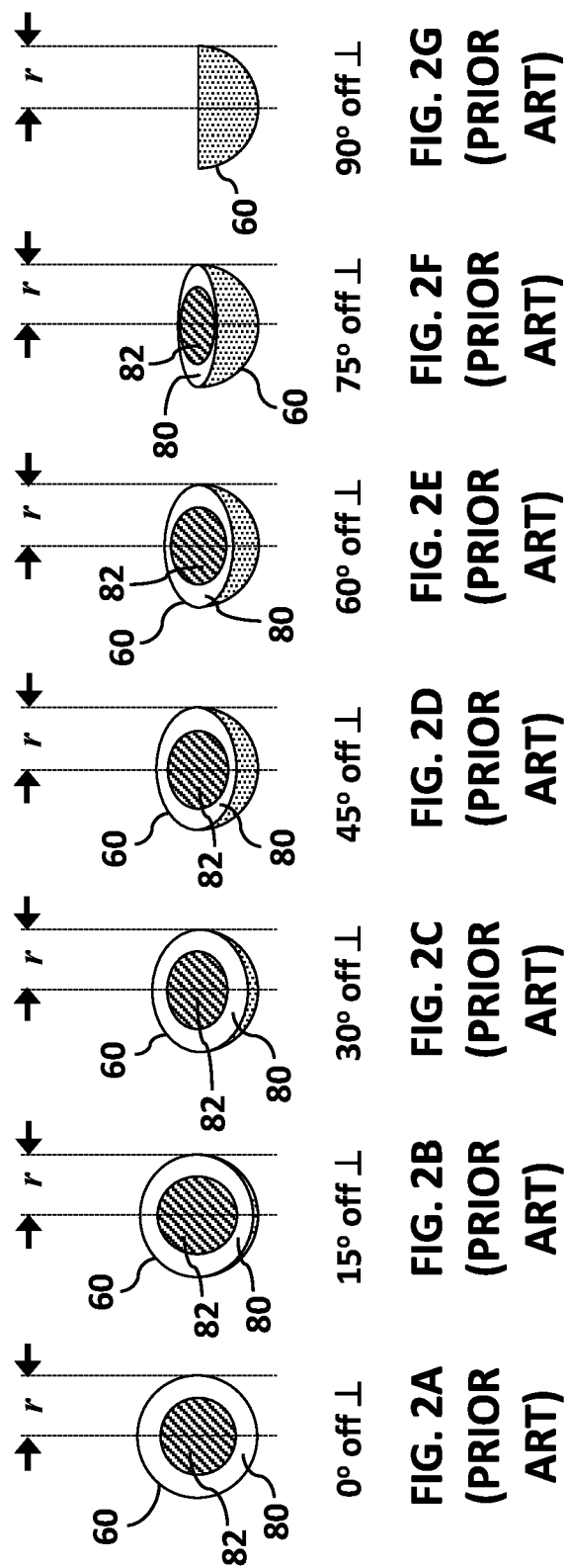
FIGS. 2A, 2B, 2C, 2D, 2E, 2F and 2G depict the hemi-bead or hemi-sphere, as seen from viewing angles which are offset 0°, 15°, 30°, 45°, 60°, 75° and 90° respectively from the perpendicular.

More particularly, in the light reflecting state, a substantial fraction of the light rays passing through the transparent outward sheet 102 undergo total internal reflection (TIR) at the inward side of the hemi-spherical surface 106. For example, the incident light ray 124 is refracted through sheet 102 and hemi-spherical surface 106. The ray undergoes TIR two or more times at the hemi-spherical:liquid TIR interface as indicated (This is also depicted in FIG. 1 for display 10 by light rays 30 and 32). The totally internally reflected ray is then refracted back through the hemi-spherical surface 106 and sheet 102 and emerges as ray 126 achieving a "white" appearance of display 100.

Other incident light rays, such as representative rays 128, are "lost" in the sense that they do not emerge outwardly from display 100. For example as depicted on the left side of the vertical dotted line in FIG. 3, representative light rays 128 may instead pass through the apertures 118 of membrane 108 and may be, for example, absorbed or redirected in a non-semi-retro-reflective manner at an inner wall portion of the aperture 118 or be absorbed by the particles 122 that are accumulated at the backplane electrode 110.

A switchable voltage can be applied across the low refractive index medium 120 containing light absorbing electrophoretically mobile particles 122 via electrodes 110 and 112. When a pixel of display 100 is switched into the light absorbing or dark state as depicted to the right of the dotted line in FIG. 3, particles 122 are electrophoretically moved through the apertures 118 of membrane 108 toward front electrode 112. The particles form a relatively thick layer on electrode 112, such that particles make optical contact with the inward side of the hemi-spherical surface 106, thus frustrating TIR (i.e. particles 122 are within about 500 nm of the hemi-spherical surface 106, or closer). The particles 122 that have been moved electrophoretically adjacent the hemi-spherical surface 106 scatter or absorb light, by modifying the imaginary and possibly the real component of the effective refractive index at the hemi-spherical:liquid TIR interface. This is illustrated by representative light rays 130 which are scattered and/or absorbed as they strike particles 122 inside the evanescent wave region at the hemi-spherical:liquid TIR interface, thus achieving a "dark" appearance in each non-reflective absorption region or pixel (This is also further represented in display 10 in FIG. 1 by light rays 52 and 54).

The net optical characteristics of display 100 can be controlled by a voltage source 132 controlling the voltage applied across the low refractive index liquid 120 via electrodes 110 and 112. The electrodes can be segmented to control the electrophoretic movement of the particles 122 suspended in liquid 120 across separate regions or pixels of hemi-spherical surface 106, thus forming an image.

The reflectance of the membrane depends on both the degree of porosity and the intrinsic reflectance of the coating material. The selection of porosity and intrinsic reflectance would depend, for example, on desired speed and overall desired reflectance as well as cost and material implications. The intrinsic reflectance of the coating material may range from about 75% to about 95%, and the porosity range from about 10% to about 50%. This means that the upper level of the reflectance may be about 86% (0.95×0.90) and the lower level would be about 38% (0.75×0.5). In one exemplary embodiment, each hemisphere in the hemi-spherical surface 106 may have a diameter of at least about 2 microns. Membrane 108 may be a flat sheet approximately 10 microns thick, perforated with about 10 micron apertures 118 spaced on roughly 30 micron centers, such that the area fraction of apertures 118 in membrane 108 is at least about 10% and up to about 50%. Metal layer 112 may be formed on membrane 108 by coating membrane 108's outward surface with a reflective conductive material such as a vacuum deposited thin metal film comprised of, but not limited to, aluminum, gold or silver. Such an embodiment of membrane 108 is about 80% reflective (i.e. approximately 80% of the light rays incident on membrane 108 do not encounter one of apertures 118 and are reflected by metal layer 112).

Backplane 134 (which bears planar backplane electrode 110) may be a conventional thin film transistor (TFT) array. Appropriate relative spacing and alignment of transparent outward sheet 102, membrane 108 and rear electrode layer 110 can be achieved by providing spacer beads and/or spacers (not shown).

In the reflective state shown on the left side of the vertical dotted line in FIG. 3, typically about half of the light rays incident on sheet 102 are reflected by TIR. The remaining light rays reach membrane 108 and 80% of those rays are reflected by metal layer 112 where a net total reflectance of about 85% may be achieved. Furthermore, if membrane 108 is positioned approximately at the focal plane of hemi-spherical surface 106, metal layer 112 will retro-reflect light rays, achieving an optical gain enhancement for all of the reflected light rays, and yielding an effective reflectance of up to 200% in lighting environments where the primary source of illumination directs light onto the outward surface of outward sheet 102 from overhead (i.e. from above the display viewer's head) or somewhat from behind, rather than the primary source of illumination being positioned in front of the viewer.

The apertured porous membrane 108 with the reflective electrode coating 112 depicted in FIG. 3 is non-registered or non-aligned to the convex hemi-spherical protrusions of the hemi-spherical surface 106. This allows some of apertures 118 to be aligned or partially aligned immediately below the pupil of each hemi-sphere. As a result, light rays that pass through the transparent outward sheet 102 and through the hemi-spherical surface 106 are lost as they pass through the apertures 118 and, for example, are absorbed or redirected in a non-semi-retro-reflective manner by the inner portion of an aperture wall or by the particles 122 accumulated at the backplane electrode 110 or by particles 122 that may be suspended in the low refractive index medium 120. Ideally, in order to minimize the amount of light rays that pass through the dark center or "pupil" of each hemi-sphere at the hemi-spherical surface 106 that are not recycled and are "lost" a preferred embodiment is to have the membrane 108 registered with the dark centers or pupils of each hemi-bead or hemi-spherical protrusion such that no apertures 118 are aligned or partially aligned below a hemi-bead or hemi-sphere pupil. Instead it is preferred to have each pupil substantially aligned with a portion of membrane 108 that is coated with the reflective electrode 112 such that light rays that pass through the dark center or pupil of each hemi-bead or hemi-sphere strikes the reflective electrode 112 and are reflected back or recycled through the pupils of the hemi-spherical surface 106 and back to the viewer creating a second mode of reflectance. Another description of this invention is to have very low porosity regions of the membrane 108 below the pupils to prevent light rays being lost in the display and high porosity elsewhere to allow for an unimpeded high rate of particle 122 movement between electrodes 110 and 112.

Figure 4:
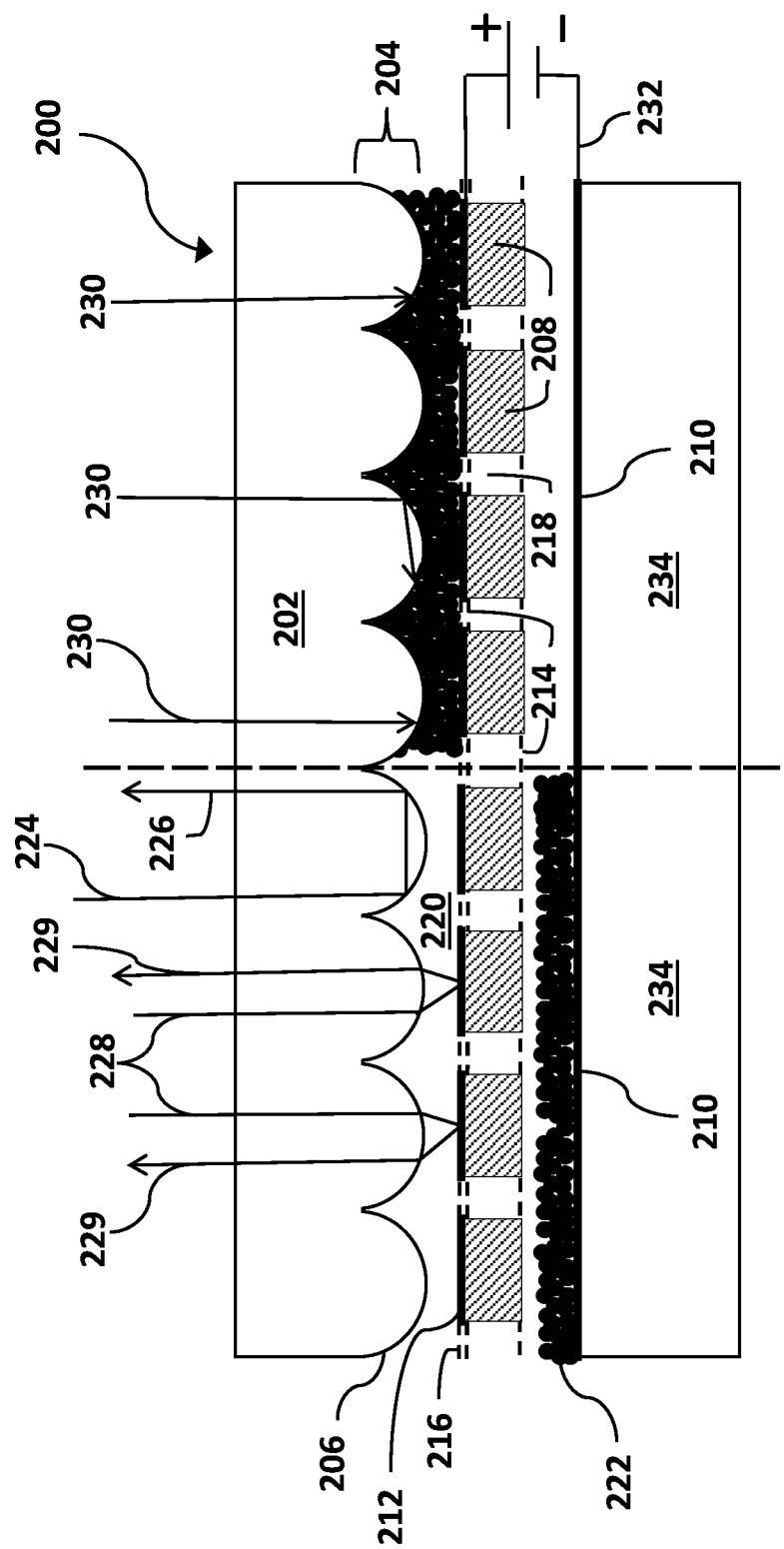
FIG. 4 depicts a TIR display in the light state (left of the dotted line) and dark state (right of the dotted line) wherein a reflective element comprising a membrane with a thin metal reflective and conductive coating is substantially registered (i.e. aligned) with the pupil of each hemi-sphere in the hemi-spherical inward surface such that light rays that pass through the pupils are reflected back through the pupils and back towards the viewer.

FIG. 4 depicts a display 200 similar to display 100 except each hemi-spherical dark center or pupil is no longer aligned with an aperture 118 directly below as shown in FIG. 3. Instead, in display 200 in FIG. 4 each pupil within the plurality of hemi-spherical protrusions 204 is substantially aligned with a portion of the continuous porous membrane 208 (dotted lines 214 imply a continuous membrane layer) that is coated with a continuous conductive reflective coating 212 (dotted lines 216 imply a continuous reflective layer) composed, for example, a metal. On the left side of the dotted line in display 200 is depicted the light or TIR state where the particles 222 are accumulated at the backplane electrode 210 by application of the appropriate voltage by a voltage source 232 across the low refractive index medium 220 with suspended electrophoretically mobile particles 222. Light rays, such as representative light ray 224, undergoes TIR and emerges as retro-reflected light ray 226. In display 100 in FIG. 3, light rays 128 that are not totally internally reflected but instead pass through the dark center or pupil of the hemi-bead or hemi-sphere and subsequently pass through apertures 118 aligned below the pupils of the hemi-spherical protrusions are not recycled and are lost by absorption or redirected in a non-semi-retro-reflective manner by the inner wall of the apertures or by the particles 122 accumulated at the backplane electrode 110 or by some other means. In contrast in display 200 in FIG. 4, membrane 208 with conductive reflective coating 212 is substantially aligned directly below the hemi-sphere pupils where incident light rays 228 are instead returned as reflected light rays 229 by the conductive reflective coating 212 back through the dark centers or pupils of the hemi-spheres and back to the viewer resulting in recycling of the light rays and an overall increase in reflectance and brightness of the display as previously mentioned above.

On the right side of the dotted line in display 200 in FIG. 4 depicts the frustrated TIR or dark state of the display. An electric field of opposite polarity to that creating the light state on the left side of the dotted line is applied by voltage source 232 across the front 212 and rear electrode 210 (rear electrode supported by backplane 234) to electrophoretically move particles 222 through apertures 218 towards the front electrode and within the evanescent region at the hemi-spherical surface 206 to frustrate TIR. Light rays 230 are thus absorbed as they pass through sheet 202 to the hemi-sphere:liquid TIR interface. The rear electrode and backplane structure may be comprised of a TFT array. Additionally, display 200 (or display 100) may further comprise a color filter array situated on the outward surface of sheet 202 (or on outward surface of sheet 102) of red, green and blue or cyan, magenta and yellow sub-pixels. Display 200 may further comprise a front light.

Ideally, one method to improve the alignment of the reflective electrode coated membrane 212 to the hemi-sphere pupils is to physically align or register the porous apertured membrane 208 comprising of a top metal layer 212 with the hemi-sphere pupils such that the coated membrane 208 is substantially directly below each hemi-sphere pupil as depicted in display 200 in FIG. 4. This may be difficult to assemble especially for a color display comprising of a color filter array where the hemi-spheres will likely need to be about 10 microns or less in diameter. Photolithography, also referred to as ultra-violet (UV) lithography or optical lithography, is a process to micro-fabricate patterns of thin films of metals or other materials with precise dimensions as small as tens of nanometers and may be utilized to align the pupils with an apertured porous membrane. The following is a non-limiting example of a photolithographic process to fabricate an aligned system as depicted in display 200 in FIG. 4. A uniform and continuous non-porous membrane 308 is coated on each side with a thin conductive reflective metal coating with metal layer 312 facing the inward hemi-spherical surface 306 and thin metal layer 319 facing the backplane electrode surface 310 as shown in display 300 in FIG. 5A. Thin metal coatings 312 and 319 may be the same composition of metal or may be different metals. Metal coatings 312 and 319 additionally may be the same or different thicknesses. For example, if the metal layer 319 facing the backplane electrode 310 is present to protect membrane 308 during the photolithographic process, it may only be necessary that this rear metal layer 319 is much thinner than the top metal layer 312 to reduce the etch time and amount of etchant used to remove metal layer 319. By metal layers 312 and 319 being of different composition, etchants may be chosen to selectively and sequentially remove the metal layers.

On top of thin metal coating 312 is coated a light-sensitive chemical photoresist 315. A variety of methods may be employed to coat the photoresist 315 such as, but not limited to, spin coating or spray coating. The metal-membrane-metal-photoresist layered structure 319-308-312-315 is placed between the hemi-spherical inward surface 306 and the backplane electrode 310 (with backplane support 334) such that the side of the structure with the photoresist top coat 315 directly faces the hemi-spherical surface 306 of the inward sheet 302 comprising of the plurality of hemi-spheres 304 as shown in FIG. 5A.

The photoresist layer 315 is irradiated with a high intensity light source 321 such as near UV or UV light that is partially collimated and perpendicular to the photoresist later 315 through each hemi-sphere dark center or pupil. All other light not striking the pupil region will be totally internally reflected and not contribute to striking the photoresist surface. The photoresist layer 315 undergoes a chemical change only where the light passes through the plurality of hemi-sphere pupils and interacts with the photoresist layer 315 creating a patterned structure. The photoresist layer 315 is then developed and rinsed with a chemical solution (i.e. developer) such that the regions not exposed to the high intensity light rays 321 are washed, rinsed or stripped away and removed to leave a patterned photoresist layer 315 as shown in FIG. 5B (Dotted lines 317 imply the photoresist layer is continuous). This process described herein is a negative photoresist process. A positive photoresist process may also be used where the area stricken by the high intensity light rays are instead washed away.

Figure 5:
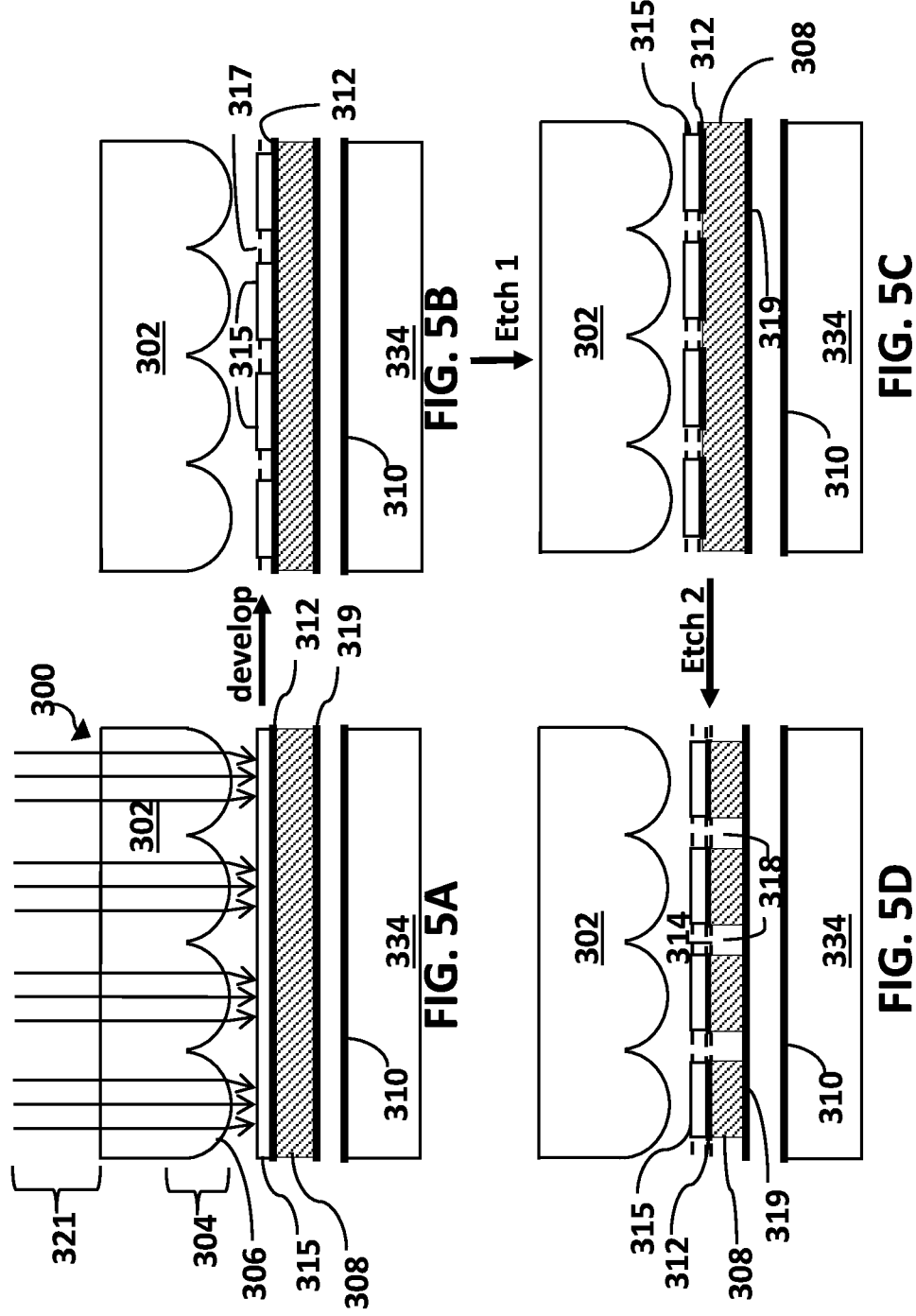
FIGS. 5A, 5B, 5C and 5D depict an idealized process to partially fabricate a display with a membrane with a thin metal conductive reflective coating aligned to the pupils of the hemi-spherical protrusions in the hemi-spherical inward surface.

The next step in an idealized process to create an aligned reflective membrane with the hemi-sphere pupils is to etch away the top metal layer 312 that is exposed and not protected by the patterned photoresist layer 315 as is shown in FIG. 5C. In this example, a selective etchant is chosen to only etch the top metal layer 312 and leave the bottom metal layer 319 unaffected. A portion of the still uniform and continuous membrane 308 is exposed as shown in FIG. 5C. Another method that may be used if top and bottom metal layers 312 and 319, respectively, are of the same chemical composition is to use a thicker bottom metal layer 319 than top metal layer 312. The etchant will remove top metal layer 312 located adjacent the hemi-spherical surface 306 that is exposed and not covered by the photoresist layer 315 first before the bottom metal layer 319 is etched away. More particularly, if top metal layer 312, for example, is 4 microns in thickness and bottom metal layer 319 is 8 microns in thickness, etching both sides with the same chemical etchant for the same amount of time at the same rate such that the top metal layer 312 is sufficiently etched away to remove a film of 4 microns, this would leave the bottom metal layer 319 thickness after etching of about 4 microns thick to be etched at a later time.

The exposed continuous membrane 308 is then etched with a second etchant to leave a continuous porous membrane 308 (represented by dotted lines 314 to imply a continuous layer) with apertures 318 as shown in FIG. 5D. The etchant used to remove the exposed portions of membrane 308 and leave a porous membrane structure may selectively etch away only the membrane which is comprised of a material that may be etched with, for example, an organic solvent or water.

Figure 6:
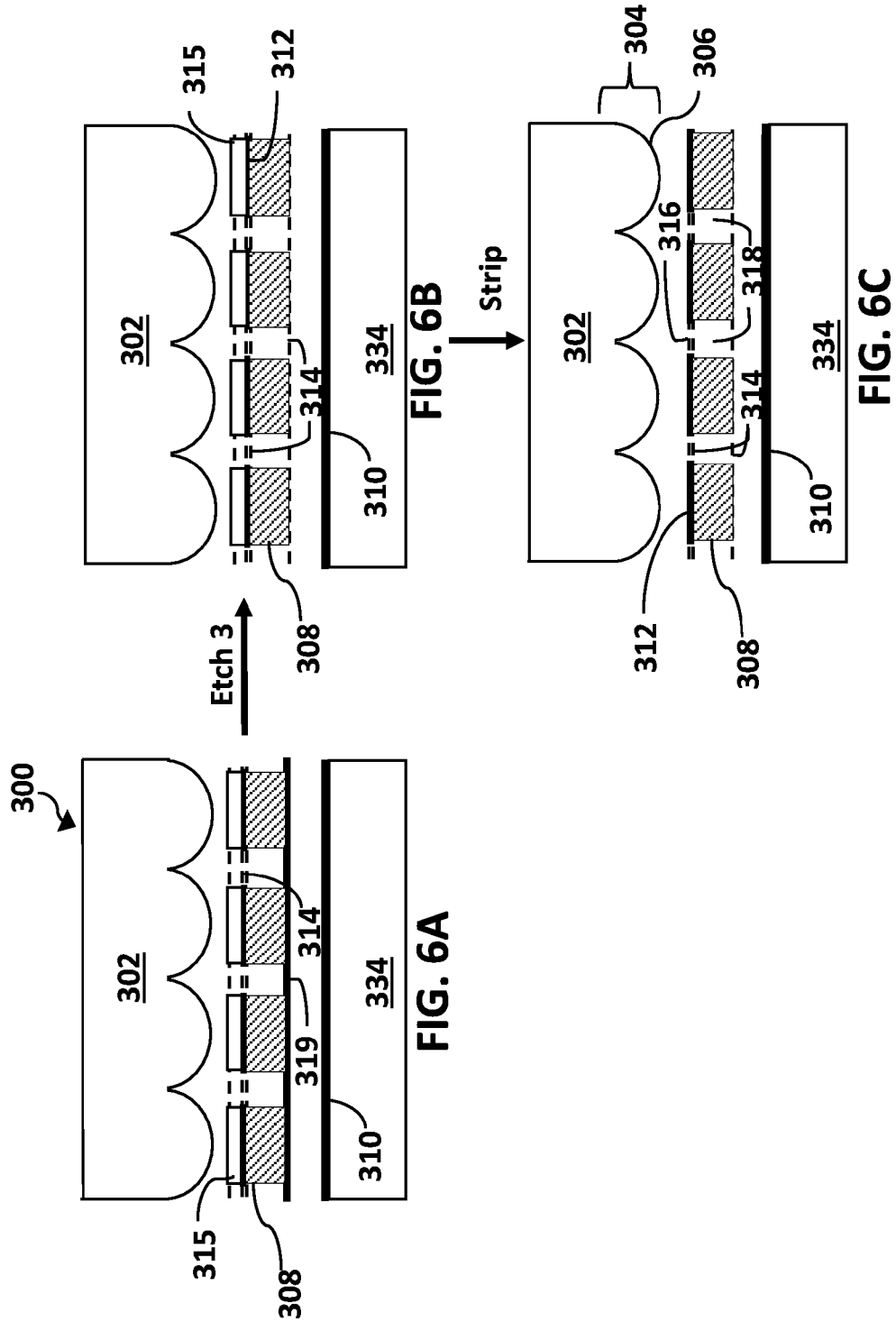
FIGS. 6A, 6B and 6C depict the remaining process steps to fabricate a display with a membrane with a thin metal reflective and conductive coating aligned to the pupils of the hemi-spherical protrusions in the hemi-spherical inward surface.

The final etch step is to remove the thin bottom metal layer 319 shown in display 300 in FIG. 6A that faces the backplane electrode 310 leaving a structure found in FIG. 6B. The remaining photoresist layer 315 is stripped away using a chemical stripper that either dissolves the photoresist and or alters the adhesion of the remaining photoresist 315 to the patterned thin top metal layer 312 such that it can easily be removed to form a display 300 that has an apertured membrane with apertures 318 comprising of a reflective conductive layer 312 aligned below each dark center or pupil of each hemi-sphere on the inward facing hemi-spherical surface 306 comprised of a plurality of hemi-spheres 304 as shown in FIG. 6C.

Figure 7:
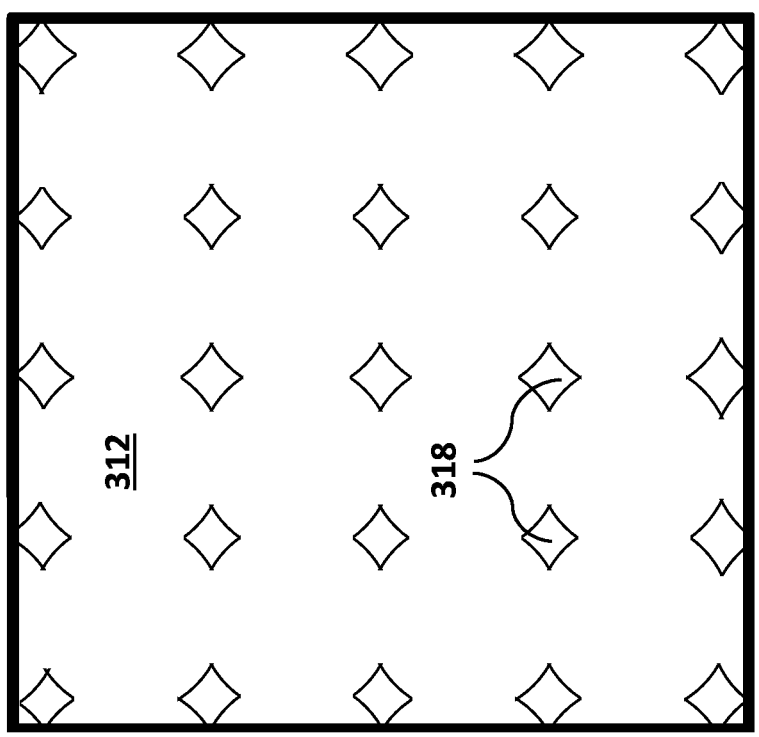
FIG. 7 is a top view of a portion of the patterned and etched porous membrane with a reflective and conductive thin metal layer showing a plurality of apertures in an ordered array.

The view of the etched membrane structure 308 with thin metal layer 312 shown in FIG. 6C is a cross section. Dotted lines 314 imply that the membrane structure is a single continuous layer and dotted lines 316 imply the metal layer is also continuous. A better view of the final etched membrane:metal structure 308:312 is shown in FIG. 7. FIG. 7 illustrates an overhead or top view of the etched membrane: metal structure 308:312 looking onto the top metal layer 312 showing a plurality of apertures 318 in an idealized ordered array corresponding to the plurality of dark centers or pupils of the hemi-spheres within the hemi-spherical layer 304 of front sheet 302. Said membrane structure has a thin conductive metal layer 312 on top of the membrane 308 preferably facing the hemi-spherical surface 306.

The display 300 shown in FIG. 6C may be further filled with a low refractive index or other common refractive index liquid medium with suspended light absorbing electrophoretically mobile particles as shown in display 200 in FIG. 4 along with additional performance enhancing additives such as, but not limited to, viscosity modifiers and particle stabilizers. The display would be driven by a voltage source. Spacers or spacer beads may additionally be added. The display 300 shown in FIG. 6C may also alternatively be filled with a gas such as air or carbon dioxide and electrophoretically mobile particles.

In the display embodiments described herein, they may be used in applications such as in, but not limited to, electronic book readers, portable computers, tablet computers, wearables, cellular telephones, smart cards, signs, watches, shelf labels, flash drives and outdoor billboards or outdoor signs.

While a number of exemplary aspects and embodiments have been discussed above, those skilled in the art will recognize certain modifications, permutations, additions and sub-combinations thereof. The above description of a frustratable TIR-based display with a substantially registered and aligned reflective element to reflect light passing through the dark pupil regions and a process to fabricate said frustratable TIR display with an aligned conductive reflective porous membrane to maximize the reflectance and brightness of the display and improve the overall performance of said TIR display is intended to be construed in an illustrative and not limitative sense.

What is claimed is:

1. A totally internally reflective display with a brightness enhancing structure, the display comprising:
    a transparent sheet comprising a plurality of transparent convex protrusions on the inward side of said sheet, each of the plurality of transparent convex protrusions further comprising a dark center;
    a backplane electrode; and
    a reflective element interposed between the convex protrusions and the backplane electrode, the reflective element aligned below the dark center of each convex protrusion to prevent light rays passing through said pupils from not substantially being recycled and reflected back to the display;
    wherein the convex protrusions are formed integrally with the transparent sheet.

2. The totally internally reflective display according to claim 1, further comprising:
    a low refractive index medium between the convex surface and backplane electrode;
    a plurality of light absorbing electrophoretically mobile particles suspended in the low refractive index medium; and
    a voltage source for applying a voltage across said low refractive index medium with said suspended light absorbing electrophoretically mobile particles, between the light reflecting electrode and the backplane electrode.

3. The totally internally reflective display according to claim 2, wherein the reflective element is an apertured membrane further comprising a conductive reflective coating to define a plurality of a front electrodes, each front electrode substantially aligned below the dark center of each of the respective convex protrusions to substantially prevent light rays passing through said pupils from not substantially being recycled and reflected back to the display.

4. The totally internally reflective display according to claim 3, wherein the voltage source is switchable to apply:
   a first voltage between the conductive light reflecting electrode and the backplane electrode, to move one or more of the particles inwardly through the apertured membrane toward the backplane electrode; and
   a second voltage between the light reflecting electrode and the backplane electrode to move substantially all of the particles outwardly through the apertured membrane toward the light reflecting electrode.

5. The totally internally reflective display according to claim 3, wherein the apertured membrane is substantially aligned with the pupils of the convex protrusions of the transparent sheet and is fabricated by a photolithographic process.

6. The totally internally reflective display according to claim 5, wherein the photolithographic process further comprises:
   coating a photoresist layer atop the metal layer of the membrane facing the hemispherical surface;
   irradiating the photoresist layer with collimated high intensity light through the pupils of the convex protrusions;
   developing the photoresist layer to leave a desired geometric pattern using a positive or negative resist method;
   etching and removing the exposed unneeded metal layer;
   etching the membrane to form apertures;
   etching the protective metal layer on the membrane facing the backplane electrode; and
   stripping the remaining photoresist.

7. The totally internally reflective display according to claim 1, further comprising a color filter array.

8. The totally internally reflective display according to claim 1, further comprising a front light.

* * * * *